(12) United States Patent
Qin et al.

(10) Patent No.: US 10,868,054 B2
(45) Date of Patent: Dec. 15, 2020

(54) PHOTOELECTRIC CONVERSION SUBSTRATE, MANUFACTURING METHOD OF THE SAME, DISPLAY PANEL AND DISPLAY DEVICE

(71) Applicant: BOE TECHNOLOGY GROUP CO., LTD., Beijing (CN)

(72) Inventors: Yunke Qin, Beijing (CN); Xue Dong, Beijing (CN); Zhifu Li, Beijing (CN); Haisheng Wang, Beijing (CN); Chunwei Wu, Beijing (CN); Yingming Liu, Beijing (CN); Yanan Jia, Beijing (CN); Lijun Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/205,759

(22) Filed: Nov. 30, 2018

(65) Prior Publication Data

US 2019/0165017 A1 May 30, 2019

(30) Foreign Application Priority Data

Nov. 30, 2017 (CN) .......................... 2017 1 1235241

(51) Int. Cl.
*H01L 31/036* (2006.01)
*H01L 29/15* (2006.01)
(Continued)

(52) U.S. Cl.
CPC .. *H01L 27/14612* (2013.01); *H01L 27/14621* (2013.01); *H01L 27/14636* (2013.01);
(Continued)

(58) Field of Classification Search
CPC ............. H01L 27/14612; H01L 31/102; H01L 31/03529; H01L 27/14692; H01L 31/147;
(Continued)

(56) References Cited

U.S. PATENT DOCUMENTS

| 2006/0001120 A1* | 1/2006 | Wright | H01L 27/14632 |
| | | | 257/452 |
| 2011/0127439 A1* | 6/2011 | Imai | H01L 27/308 |
| | | | 250/370.08 |

(Continued)

FOREIGN PATENT DOCUMENTS

| CN | 105140250 A | 12/2015 |
| CN | 106463080 A | 2/2017 |
| CN | 106611170 A | 5/2017 |

OTHER PUBLICATIONS

First Chinese Office Action dated Nov. 28, 2019, received for corresponding Chinese Application No. 201711235241.4, 11 pages.

*Primary Examiner* — Ismail A Muse
(74) *Attorney, Agent, or Firm* — Kinney & Lange, P.A.

(57) ABSTRACT

A photoelectric conversion substrate, a method for manufacturing the photoelectric conversion substrate, a display panel and a display device are provided. The photoelectric conversion substrate includes a TFT and a photosensitive element on a base substrate, wherein the photosensitive element includes a light-transmissible electrode, a signal output electrode, and a photosensitive layer between the light-transmissible electrode and the signal output electrode. The light-transmissible electrode allows predetermined light rays to pass therethrough and to be incident onto the photosensitive layer, and the signal output electrode is connected to the TFT, and the photosensitive layer is an uneven layer.

9 Claims, 9 Drawing Sheets

(51) Int. Cl.
  *H01L 29/04* (2006.01)
  *H01L 27/14* (2006.01)
  *H01L 27/146* (2006.01)
  *H01L 31/0352* (2006.01)
  *H01L 31/0224* (2006.01)
  *H01L 31/147* (2006.01)
  *H01L 31/102* (2006.01)

(52) U.S. Cl.
  CPC ............... *H01L 27/14692* (2013.01); *H01L 31/022466* (2013.01); *H01L 31/03529* (2013.01); *H01L 31/035281* (2013.01); *H01L 31/102* (2013.01); *H01L 31/147* (2013.01); *Y02P 70/50* (2015.11)

(58) Field of Classification Search
  CPC ....... H01L 31/022466; H01L 27/14621; H01L 27/14636; H01L 31/035281; H01L 31/18; H01L 27/1443; Y02P 70/521; G06F 2203/04103; G06F 3/042
  See application file for complete search history.

(56) References Cited

U.S. PATENT DOCUMENTS

| | | | |
|---|---|---|---|
| 2011/0241701 A1* | 10/2011 | Imai | G01J 1/44 324/629 |
| 2012/0049044 A1* | 3/2012 | Kuboi | H01L 27/1464 250/208.1 |
| 2013/0048960 A1* | 2/2013 | Nishino | H01L 27/30 257/40 |
| 2013/0140568 A1* | 6/2013 | Miyamoto | H01L 31/0248 257/53 |
| 2013/0342722 A1* | 12/2013 | Kuboi | H01L 27/307 348/222.1 |
| 2015/0295014 A1* | 10/2015 | Lee | H01L 51/5209 257/40 |
| 2015/0362776 A1 | 12/2015 | Jikumaru et al. | |
| 2016/0013243 A1* | 1/2016 | O'Rourke | H01L 31/028 257/43 |
| 2016/0049431 A1* | 2/2016 | Taghibakhsh | H01L 27/14638 250/370.08 |
| 2016/0232397 A1* | 8/2016 | Yu | G06K 9/00046 |
| 2017/0236857 A1 | 8/2017 | Bu | |
| 2018/0061876 A1* | 3/2018 | Miyamoto | H01L 27/1225 |
| 2019/0005295 A1* | 1/2019 | Jia | G06K 9/0004 |
| 2019/0035854 A1* | 1/2019 | Yamaguchi | H01L 27/14636 |
| 2019/0050621 A1* | 2/2019 | Xu | G06F 21/32 |
| 2019/0072677 A1* | 3/2019 | Jung | H01L 27/14658 |
| 2019/0074321 A1* | 3/2019 | Na | H01L 27/14663 |
| 2019/0123080 A1* | 4/2019 | Kanicki | H01L 27/308 |
| 2020/0035745 A1* | 1/2020 | Takita | H04N 5/32 |
| 2020/0127055 A1* | 4/2020 | Misaki | H01L 27/308 |

* cited by examiner

PHOTOELECTRIC CONVERSION SUBSTRATE, MANUFACTURING METHOD OF THE SAME, DISPLAY PANEL AND DISPLAY DEVICE

CROSS-REFERENCE TO RELATED APPLICATION

The present application claims a priority of a Chinese patent application No. 201711235241.4 filed in China on Nov. 30, 2017, the disclosure of which is incorporated herein by reference in its entirety.

TECHNICAL FIELD

The present disclosure relates to a field of photoelectric technology, in particular to a photoelectric conversion substrate, a manufacturing method of the photoelectric conversion substrate, a display panel and a display device.

BACKGROUND

An optical sensor including thin film transistors (TFTs) and photodiodes has such advantages as a simple process for manufacturing the optical sensor and a small volume of the optical sensor. A photoelectric conversion efficiency of a photodiode is one critical factor for determining a performance of an entirety of the optical sensor.

When visible light is converted into an electric signal by the photodiode, the visible light may often be scattered, causing an absorption efficiency of the visible light to be low and thereby affecting a detection accuracy of the optical sensor adversely.

SUMMARY

A photoelectric conversion substrate, a method for manufacturing the photoelectric conversion substrate, a display panel and a display device are provided.

In a first aspect, a photoelectric conversion substrate is provided in the present disclosure and includes a thin film transistor (TFT) and a photosensitive element on a base substrate, wherein the photosensitive element includes a light-transmissible electrode, a signal output electrode, and a photosensitive layer between the light-transmissible electrode and the signal output electrode. The light-transmissible electrode is configured to allow predetermined light rays to pass through the light-transmissible electrode and to be incident onto the photosensitive layer, and the signal output electrode is connected to the TFT, and the photosensitive layer is an uneven layer.

Optionally, the photoelectric conversion substrate further includes an insulation layer on the base substrate, wherein a surface of the insulation layer is uneven, and the photosensitive element is on the insulation layer.

Optionally, the insulation layer includes a plurality of protrusive portions spaced apart from each other or a plurality of concave portions spaced apart from each other, and a portion or an entirety of the photosensitive element is on the plurality of protrusive portions spaced apart from each other or the plurality of concave portions spaced apart from each other.

Optionally, the insulation layer is above the TFT and includes a first via-hole through which a second electrode of the TFT is exposed, and the signal output electrode is connected to the second electrode of the TFT through the first via-hole.

Optionally, the TFT is above the insulation layer, and a second electrode of the TFT is re-used as the signal output electrode.

Optionally, the photoelectric conversion substrate further includes a gate insulation layer covering a gate electrode of the TFT and the insulation layer.

Optionally, a gate electrode of the TFT is on a first portion of the base substrate, the insulation layer is on a second portion of the base substrate different from the first portion of the base substrate, and the gate electrode is spaced apart from the insulation layer.

Optionally, the insulation layer is a whole-layer structure on the base substrate, and a gate electrode of the TFT is on the insulation layer and directly contacts with the insulation layer.

Optionally, the photoelectric conversion substrate further includes an interlayer insulation layer between the insulation layer and the TFT, and a signal transmission line on the interlayer insulation layer, wherein the first via-hole penetrates through the insulation layer and the interlayer insulation layer so as to expose the second electrode of the TFT, the interlayer insulation layer includes a second via-hole through which a first electrode of the TFT is exposed, and the signal transmission line is connected to the first electrode through the second via-hole.

Optionally, the photoelectric conversion substrate further includes a planarization layer covering the TFT and the insulation layer, and a signal transmission line on the planarization layer, wherein the planarization layer includes a second via-hole through which a first electrode of the TFT is exposed, and the signal transmission line is connected to the first electrode through the second via-hole.

Optionally, the light-transmissible electrode is made of a transparent conductive material or a nontransparent conductive material, and the predetermined light rays include at least one of visible light rays and infrared light rays.

Optionally, each of the plurality of protrusive portions is a column shape, a hemispherical shape or a step shape.

In a second aspect, a method for manufacturing a photoelectric conversion substrate is provided in the present disclosure, and includes forming a Thin Film Transistor (TFT) and a photosensitive element on a base substrate, wherein the forming the photosensitive element includes forming a signal output electrode, an uneven photosensitive layer and a light-transmissible electrode sequentially on the base substrate, the photosensitive layer is between the signal output electrode and the light-transmissible electrode, and the signal output electrode is connected to the TFT.

Optionally, the forming the TFT and the photosensitive element on the base substrate includes: forming the TFT on the base substrate; forming an insulation material layer onto the base substrate on which the TFT is formed, and patterning the insulation material layer so as to form an insulation layer having an uneven surface; and forming the photosensitive element on the insulation layer.

Optionally, the forming the TFT and the photosensitive element on the base substrate includes: forming an insulation material layer onto the base substrate, and patterning the insulation material layer so as to form an insulation layer, wherein the insulation layer includes a first portion having an even surface and a second portion having an uneven surface; forming the TFT on the first portion of the insulation layer; and forming the photosensitive element on the second portion of the insulation layer, wherein a second electrode of the TFT is re-used as the signal output electrode of the photosensitive element.

Optionally, the forming the TFT and the photosensitive element on the base substrate includes: forming an insulation material layer onto a first portion of the base substrate, and patterning the insulation material layer so as to form an insulation layer having an uneven surface; forming the TFT on a second portion of the base substrate different from the first portion of the base substrate, the insulation layer being spaced apart from the TFT; and forming the photosensitive element on the first portion of the insulation layer, wherein a second electrode of the TFT is re-used as the signal output electrode of the photosensitive element.

In a third aspect, a display panel is provided in the present disclosure, and includes the photoelectric conversion substrate according to the first aspect.

Optionally, the display panel further includes a color filter substrate and a backlight source, wherein the color filter substrate is opposite to the photoelectric conversion substrate, the backlight source is at a side of the photoelectric conversion substrate away from the color filter substrate and includes a predetermined light source for emitting predetermined light rays; the color filter substrate includes a black matrix configured to shield a region where the TFT is located, and the black matrix includes an aperture corresponding to the photosensitive element.

DETAILED DESCRIPTION

Figure 1A:
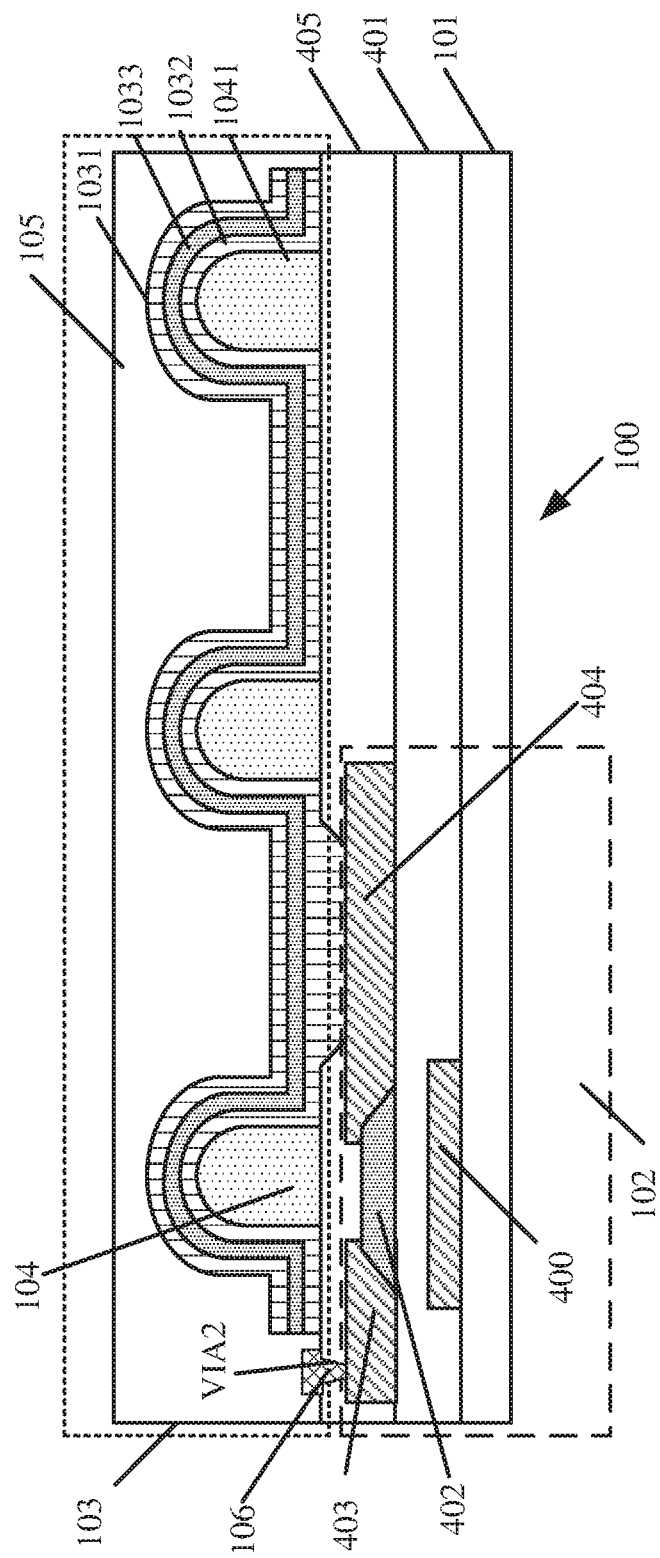
FIGS. 1A-1D are schematic views of a photoelectric conversion substrate according to some embodiments of the present disclosure.

In order to make technical problems to be solved by the present disclosure, and technical solutions and advantages of the present disclosure more apparent, detailed description will be provided hereinafter in conjunction with drawings and embodiments.

Some embodiments of the present disclosure provide a photoelectric conversion substrate, a method for manufacturing the photoelectric conversion substrate, a display panel and a display device, so as to improve a detection accuracy of the photoelectric conversion substrate.

A connection mentioned in the present disclosure may be a direct connection or an indirect connection, or may be an electrical connection or a mechanical connection.

Referring to FIGS. 1A to 1D, some embodiments of the present disclosure provide a photoelectric conversion substrate 100. The photoelectric conversion substrate 100 includes a Thin Film Transistor (TFT) 102 and a photosensitive element 103 on a base substrate 101. The photosensitive element 103 includes a light-transmissible electrode 1031, a signal output electrode 1032 and a photosensitive layer 1033 between the light-transmissible electrode 1031 and the signal output electrode 1032. The light-transmissible electrode 1031 is configured to allow predetermined light rays to pass through the light-transmissible electrode 1031 and be illuminated on the photosensitive layer 1033. The signal output electrode 1032 is connected to the TFT 102. The photosensitive layer 1033 is an uneven layer. The TFT 102 includes a gate electrode 400, a gate insulation layer 401 covering the gate electrode 400, an active layer 402 on the gate insulation layer 401, and a first electrode and a second electrode at both sides of the active layer 402. The first electrode is one of a source electrode and a drain electrode, and the second electrode is the other one of the source electrode and the drain electrode. FIGS. 1A to 1D only show that the first electrode is the source electrode 403 and the second electrode is the drain electrode 404.

In the present disclosure, the uneven photosensitive layer may increase an area of the photosensitive layer so that a photosensitive area of the photosensitive layer may be increased and an absorption efficiency of the photosensitive element to light rays may be enhanced, thereby improving photosensitivity of the photosensitive element as well as the detection accuracy of the photoelectric conversion substrate.

Specifically, the photosensitive element 103 may be a photodiode and include the light-transmissible electrode 1031, the signal output electrode 1032 and the photosensitive layer 1033 between the light-transmissible electrode 1031 and the signal output electrode 1032. The light-transmissible electrode 1031 may allow the predetermined light rays to pass through the light-transmissible electrode 1031. When the predetermined light rays pass through the light-transmissible electrode 1031 and are incident onto the photosensitive layer 1033, photons carrying energy may enter a PN junction of the photosensitive layer 1033 and the energy may be delivered to bound electrons in a covalent bond, causing that parts of the electrons break away from the covalent bond and electron-hole pairs, i.e., photon-generated carriers, are generated. The signal output electrode 1032 is configured to receive the carriers so as to convert an optical signal into an electric signal.

Optionally, the photoelectric conversion substrate 100 further includes an insulation layer 104 on the base substrate 101. A surface of the insulation layer 104 is uneven and the photosensitive element 103 is on the insulation layer 104.

Through configuring the insulation layer 104 having the uneven surface on the base substrate 101, and arranging the photosensitive element 103 on the insulation layer 104, the photosensitive element 103 may also be uneven. In this way, not only the area of the photosensitive layer 1033 may be increased, but also an area of the signal output electrode 1032 may be increased, and thus the signal output electrode 1032 may receive more carriers and further improve the detection accuracy of the photoelectric conversion substrate 100.

The insulation layer 104 may be made of organic materials or inorganic materials, or may be formed by organic layers made of the organic materials and inorganic layers made of the inorganic materials, wherein the organic layers and the inorganic layers may be stacked one above anther. A quantity of the organic layers may be one or more than one; and a quantity of the inorganic layers may be one or more than one, and the organic layers and the inorganic layers may be arranged one above another alternately. Specifically, a surface of the insulation layer 104 may be formed with at least one of a plurality of protrusive portions 1041 or at least one of a plurality of concave portions 1042, and the photosensitive element 103 may be on the insulation layer 104, so that the photosensitive layer 1033, the light-transmissible electrode 1031 and the signal output electrode 1032 of the photosensitive element 103 are all uneven.

Figure 1B:
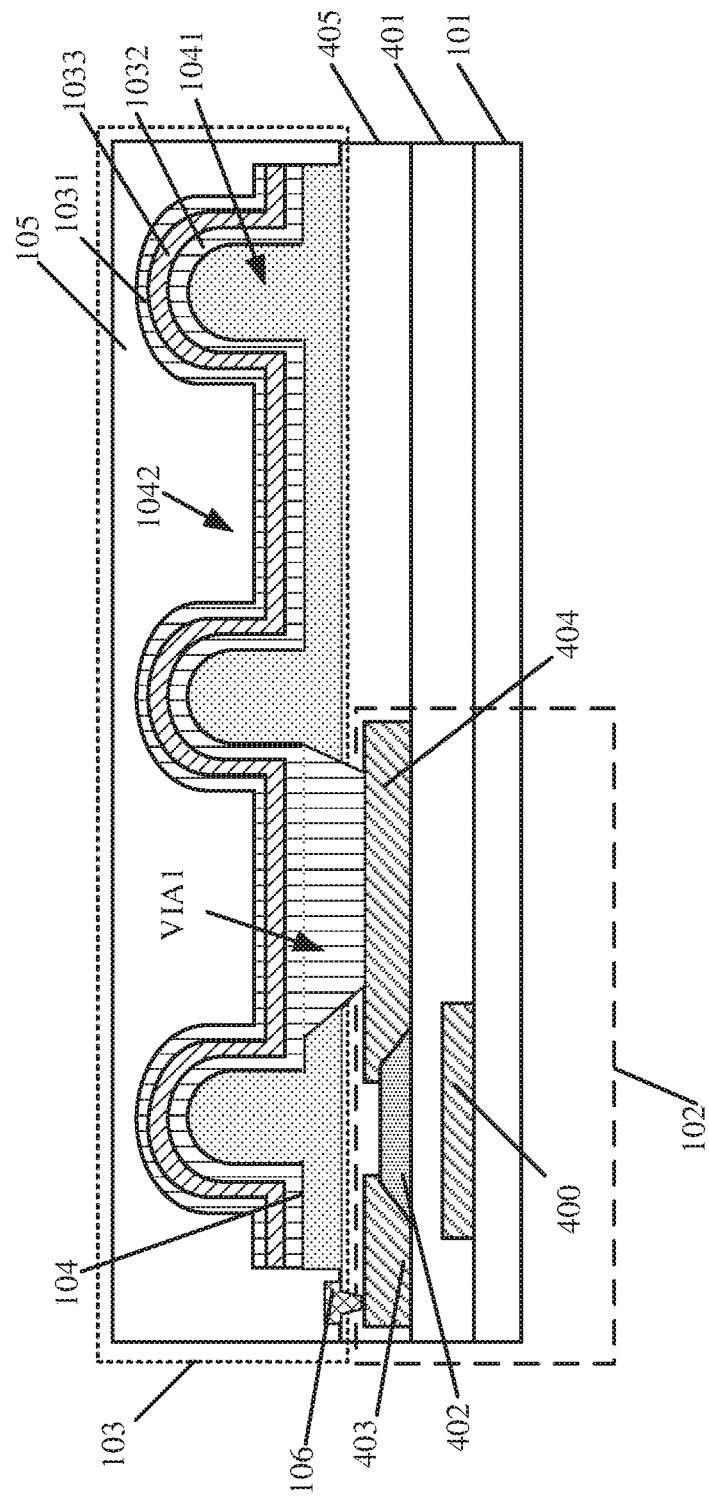

Optionally, referring to FIGS. 1A and 1B, the insulation layer 104 may be above the TFT 102. In such a case, the photoelectric conversion substrate 100 may further include an interlayer insulation layer 405 between the TFT 102 and the photosensitive element 103. The insulation layer 104 may be formed of a whole-layer structure above the interlayer insulation layer 405, as shown in FIG. 1B. This whole-layer structure includes the plurality of protrusive portions 1041 spaced apart from each other, and the plurality of concave portions 1042 may be formed between any two adjacent protrusive portions of the plurality of protrusive portions 1041. Optionally, the whole-layer structure may include a plurality of concave portions spaced apart from each other and an even upper surface of the insulation layer may be located between any two adjacent concave portions of the plurality of concave portions, or the whole-layer structure may include a plurality of protrusive portions and a plurality of concave portions arranged alternately.

Optionally, the insulation layer 104 may also be a patterned non-whole-layer structure above the interlayer insulation layer 405, as shown in FIG. 1A, and this non-whole-layer structure may include the plurality of protrusive portions 1041 spaced apart from each other.

At least a portion of the photosensitive element 103 is arranged on at least one of the plurality of protrusive portions 1041 or at least one of the plurality of concave portions 1042. The areas of the photosensitive layer 1033 and the signal output electrode 1032 may be increased as long as at least a portion of the photosensitive element 103 is on at least one of the protrusive portions 1041 or at least one of the concave portions 1042, so as to improve the detection accuracy of the photoelectric conversion substrate 100. Specifically, a portion or an entirety of the photosensitive element 103 may be on at least one of the plurality of protrusive portions 1041 or at least one of the plurality of concave portions 1042 spaced apart from each other. In case that the entirety of the photosensitive element 103 is on at least one of the protrusive portions 1041 or at least one of the concave portions 1042, the areas of the photosensitive layer 1033 and the signal output electrode 1032 may be increased to a maximum extent.

Each of the protrusive portions 1041 may be of a column shape, a hemispherical shape or a step shape, as long as the protrusive portion protrudes from the surface of the insulation layer 104. Each of the concave portions 1042 may also be of the column shape, the hemispherical shape or the step shape.

The more uneven the surface of the photosensitive element 103 is, the larger the area of the photosensitive element 103 is. In order to make the photosensitive element 103 have a relatively large area, a thickness of the insulation layer 104 may be relatively large, so as to make the surface of the photosensitive element 103 more uneven. Optionally, the thickness of the insulation layer 104 may be in a range of 1 µm to 5 µm. Optionally, each of the plurality of protrusive portions 1041 may have a height in a range of 1 µm to 5 µm, or each of the plurality of concave portions 1042 may have a depth in a range of 1 µm to 5 µm.

Since an insulation layer made of organic resins usually has a relatively large thickness, the insulation layer 104 may be made of the organic resins.

Optionally, the photoelectric conversion substrate 100 further includes a planarization layer 105 covering the photosensitive element 103. On one hand, the planarization layer 105 may cause a surface of the photoelectric conversion substrate 100 to be even so as to facilitate subsequent manufacturing processes. On the other hand, the planarization layer 105 may perform a protective function for protecting the photosensitive element 103. The planarization layer 105 may be made of an oxide, a nitride or an oxynitride. Specifically, the planarization layer 105 may be made of at least one of SiNx, SiOx, Si(ON)x, or $Al_2O_3$. The planarization layer 105 may also be a single-layer structure, or a double-layer structure formed of a SiNx layer and a SiOx layer.

Optionally, the photoelectric conversion substrate 100 may further include a signal transmission line 106, and the interlayer insulation layer 405 may further include a second via-hole VIA2 through which the first electrode of the TFT is exposed. The signal transmission line 106 may be connected to the first electrode of the TFT 102 through the second via-hole VIA2, and the signal output electrode 1032 may be connected to the second electrode of the TFT 102. When the photosensitive layer 103 is irradiated with the predetermined light rays, an electric signal may be generated and then may be transmitted to an external detection circuit through the signal transmission line 106 so as to detect the light rays by the detection circuit.

In the photoelectric conversion substrate 100, the insulation layer 104 may be arranged above the TFT 102. The interlayer insulation layer 105 may further include a first via-hole VIA1 through which the second electrode of the TFT 102 is exposed. The signal output electrode 1032 may be connected to the second electrode of the TFT 102 through the first via-hole VIA1.

Figure 1C:
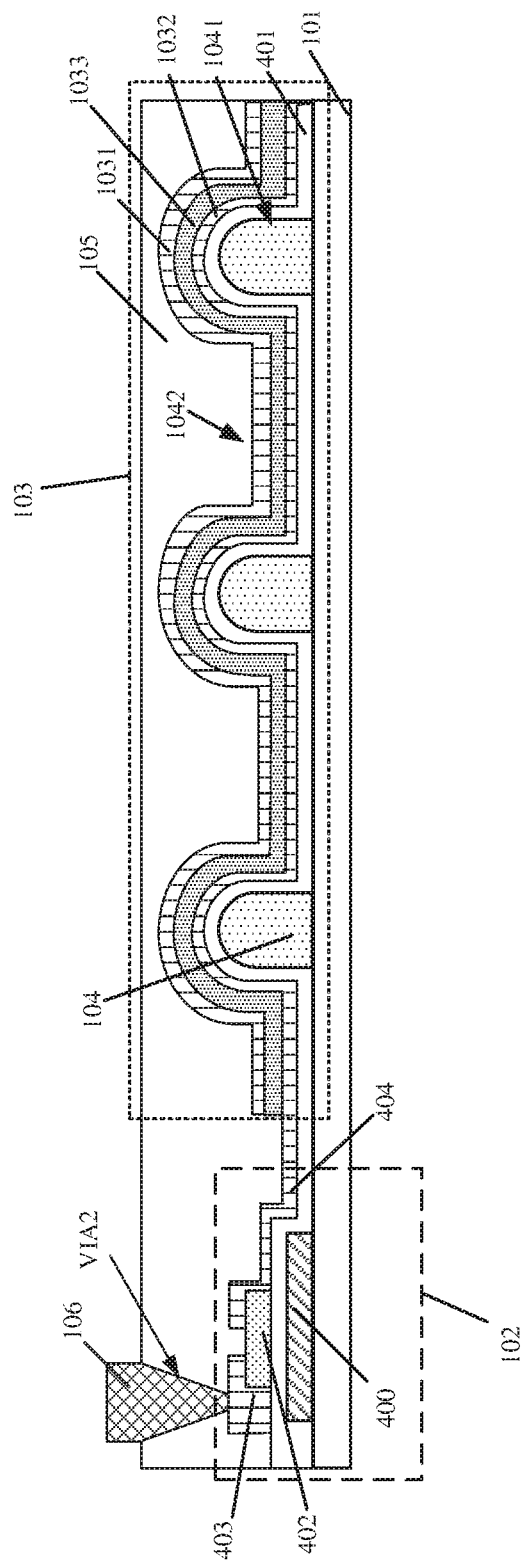

Optionally, in the photoelectric conversion substrate 100, the TFT 102 and the insulation layer 104 may also be directly arranged on the base substrate 101. Referring to FIG. 1C, the gate electrode 400 of the TFT 102 may be arranged on the base substrate 101, and the gate insulation layer 401 may cover the gate electrode 400 and the insulation layer 104. The second electrode of the TFT 102 may be re-used as the signal output electrode 1032. Although the insulation layer 104 is of the patterned non-whole-layer structure shown in FIG. 1C, the insulation layer 104 may also be an uneven whole-layer structure, as long as the insulation layer is spaced apart from the gate electrode.

Figure 1D:
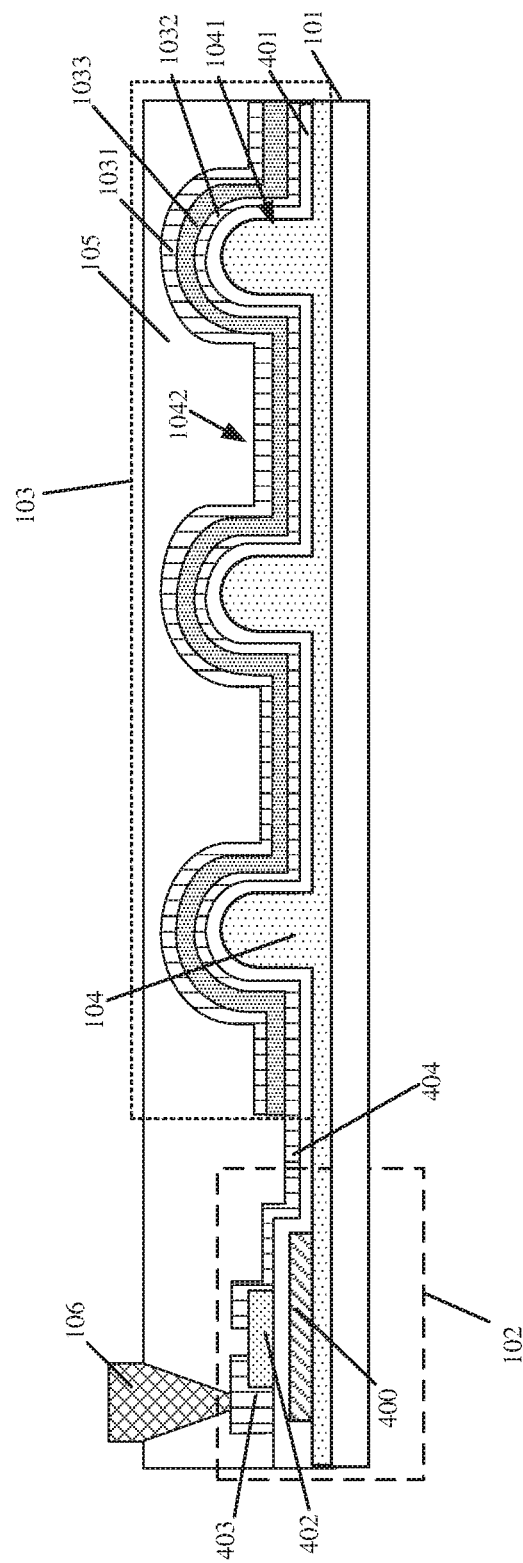

Optionally, in the photoelectric conversion substrate 100, the TFT 102 may also be arranged above the insulation layer 104. Referring to FIG. 1D, the insulation layer 104 may be of a whole-layer structure arranged above the base substrate 101, and the whole-layer structure may include the plurality of protrusive portions 1041 spaced apart from each other. The gate electrode 400 of the TFT 102 may be arranged on the insulation layer 104, and the gate insulation layer 401 may cover the gate electrode 400 and the insulation layer 104. The second electrode of the TFT 102 may be re-used as the signal output electrode 1032.

In case that the second electrode of the TFT is re-used as the signal output electrode, a structure of the photoelectric conversion substrate 100 may be simplified and thereby a manufacture cost of the photoelectric conversion substrate may be reduced.

In some embodiments of the present disclosure, the predetermined light rays that may be detected by the photosensitive element 103 include visible light rays and infrared light rays. The photoelectric conversion substrate 100 may detect both the visible light rays and the infrared light rays. The light-transmissible electrode 1031 may be made of transparent conductive materials or non-transparent conductive materials. In case that the light-transmissible electrode 1031 is made of the transparent conductive materials, the visible light rays may be allowed to pass through the light-transmissible electrode 1031, so that the photoelectric conversion substrate 100 may detect the visible light rays. In case that the light-transmissible electrode 1031 is made of the non-transparent conductive materials, the infrared light rays rather than the visible light rays may be allowed to pass through the light-transmissible electrode 1031 formed of the non-transparent conductive materials, and the photoelectric conversion substrate 100 may detect the infrared light rays.

Figure 2A:
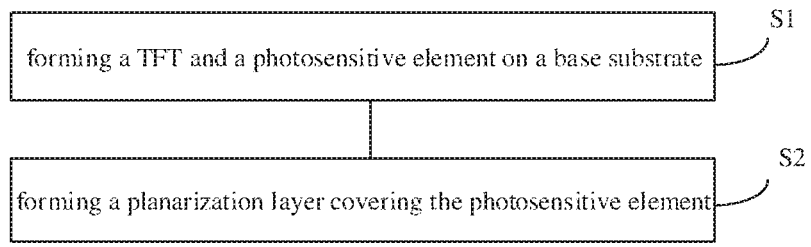
FIG. 2A is a flowchart of a method for manufacturing the photoelectric conversion substrate according to some embodiments of the present disclosure.

Some embodiments of the present disclosure further provide a method for manufacturing a photoelectric conversion substrate. The method may be used to manufacture the photoelectric conversion substrate of the present disclosure. As shown in FIG. 2A, the method includes a step S1.

Step S1: forming a Thin Film Transistor (TFT) and a photosensitive element on a base substrate.

The forming the photosensitive element may include forming a signal output electrode, an uneven photosensitive layer and a light-transmissible electrode sequentially on the base substrate, wherein the photosensitive layer is between the signal output electrode and the light-transmissible electrode, and the signal output electrode is connected to the TFT.

In some embodiments of the present disclosure, the photosensitive layer of the photosensitive element is uneven. The uneven photosensitive layer may increase an area of the photosensitive layer so that a photosensitive area of the photosensitive element may be increased and an absorption efficiency of the photosensitive element to light rays may be enhanced, thereby improving the photosensitivity of the photosensitive element and increasing a detection accuracy of the photoelectric conversion substrate.

Figure 2B:
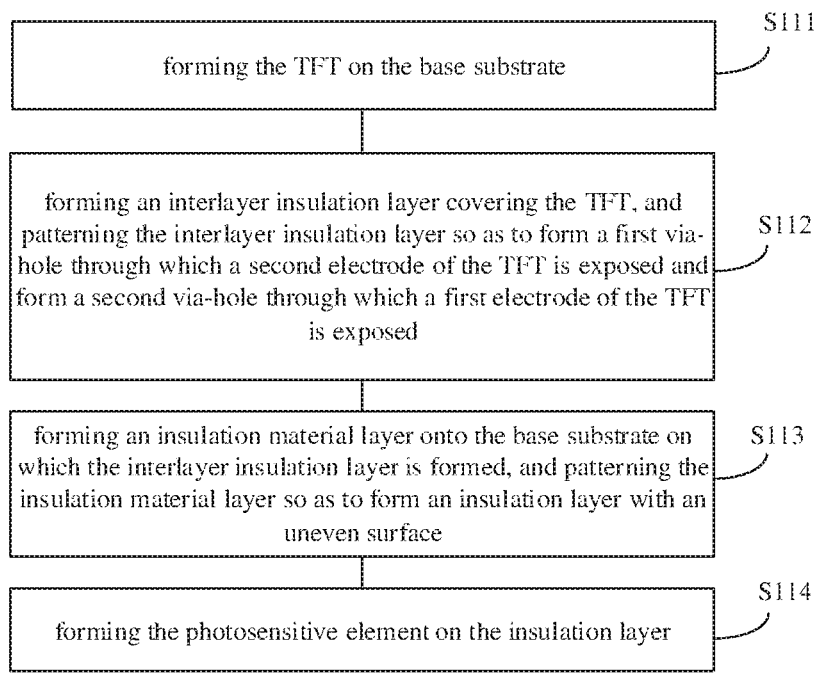
FIGS. 2B-2D are detailed flowcharts of steps in the method for manufacturing the photoelectric conversion substrate shown in FIG. 2A.
Figure 2C:
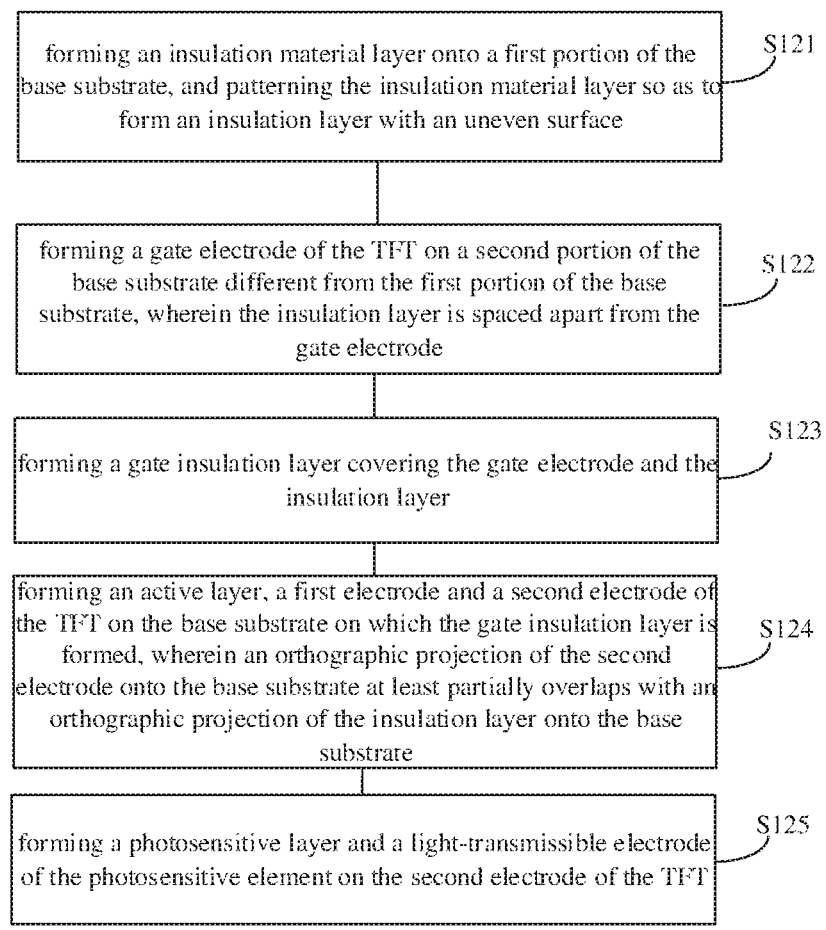
Figure 2D:
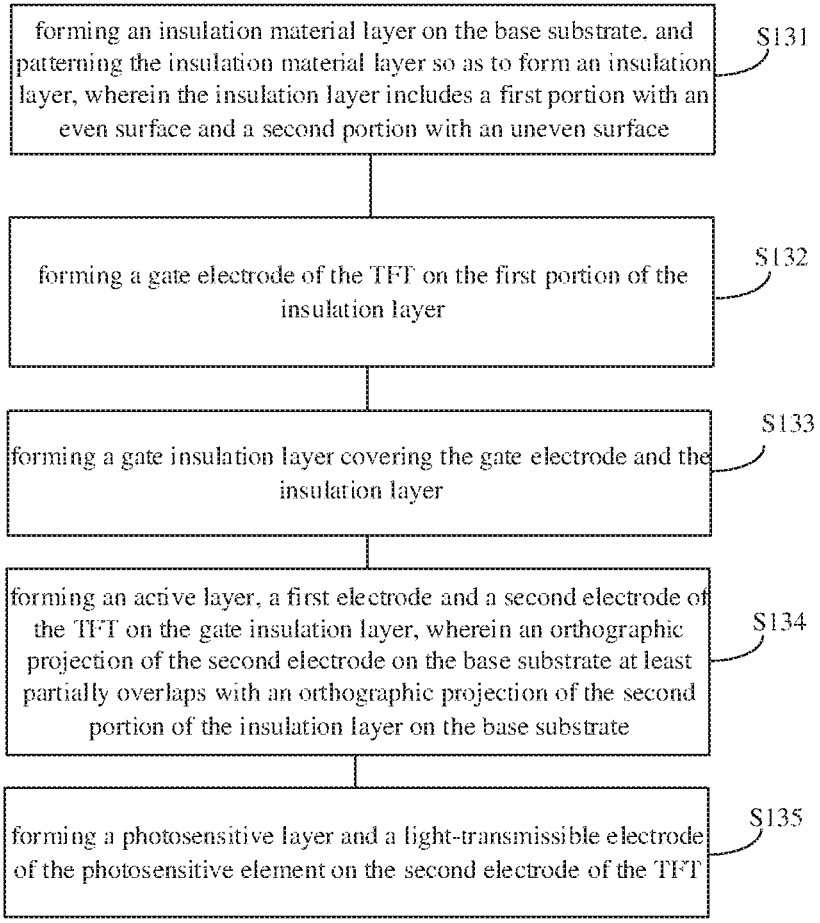

Optionally, in case of manufacturing the photoelectric conversion substrate as shown in FIG. 1A or FIG. 1B of the present disclosure, the step S1 in the method for manufacturing the photoelectric conversion substrate may include sub-steps S111-S114, as shown in FIG. 2B.

Sub-step S111: forming the TFT on the base substrate.

Sub-step S112: forming an interlayer insulation layer covering the TFT, and patterning the interlayer insulation layer so as to form a first via-hole through which a second electrode of the TFT is exposed and form a second via-hole through which a first electrode of the TFT is exposed.

Sub-step S113: forming an insulation material layer onto the base substrate on which the interlayer insulation layer is formed, and patterning the insulation material layer so as to form an insulation layer with an uneven surface.

Sub-step S114: forming the photosensitive element on the insulation layer.

Optionally, in case of manufacturing the photoelectric conversion substrate as shown in FIG. 1C, the step S1 in the method for manufacturing the photoelectric conversion substrate may include sub-steps S121-S125.

Sub-step S121: forming an insulation material layer onto a first portion of the base substrate, and patterning the insulation material layer so as to form an insulation layer with an uneven surface.

Sub-step S122: forming a gate electrode of the TFT on a second portion of the base substrate different from the first portion of the base substrate, wherein the insulation layer is spaced apart from the gate electrode.

Sub-step S123: forming a gate insulation layer covering the gate electrode and the insulation layer.

Sub-step S124: forming an active layer, a first electrode and a second electrode of the TFT on the base substrate on which the gate insulation layer is formed, wherein an orthographic projection of the second electrode onto the base substrate at least partially overlaps with an orthographic projection of the insulation layer onto the base substrate.

Sub-step S125: forming a photosensitive layer and a light-transmissible electrode of the photosensitive element on the second electrode of the TFT.

Optionally, in case of manufacturing the photoelectric conversion substrate as shown in FIG. 1D, the step S1 in the method for manufacturing the photoelectric conversion substrate may include sub-steps S131-S135.

Sub-step S131: forming an insulation material layer on the base substrate, and patterning the insulation material layer so as to form an insulation layer, wherein the insulation layer includes a first portion with an even surface and a second portion with an uneven surface.

Sub-step S132: forming a gate electrode of the TFT on the first portion of the insulation layer.

Sub-step S133: forming a gate insulation layer covering the gate electrode and the insulation layer.

Sub-step S134: forming an active layer, a first electrode and a second electrode of the TFT on the gate insulation layer, wherein an orthographic projection of the second electrode on the base substrate at least partially overlaps with an orthographic projection of the second portion of the insulation layer on the base substrate.

Sub-step S135: forming a photosensitive layer and a light-transmissible electrode of the photosensitive element on the second electrode of the TFT.

Because the surface of the insulation layer is uneven and the photosensitive element is arranged on the insulation layer, the photosensitive element is also uneven. In this way, not only the area of the photosensitive layer may be increased, but also an area of the signal output electrode may be increased, and thereby the signal output electrode may receive more carriers and the detection accuracy of the photoelectric conversion substrate may be further increased.

Furthermore, the method may include a step S2.

Step S2: forming a planarization layer covering the photosensitive element.

On one hand, the planarization layer may cause the surface of the photoelectric conversion substrate to be even so as to facilitate subsequent manufacture processes. On the other hand, the planarization layer may perform the protective function for protecting the photosensitive element.

The method for manufacturing the photoelectric conversion substrate will be described in details hereinafter in conjunction with drawings. The method described hereinafter is described through manufacturing the photoelectric conversion substrate shown in FIG. 1A of the present disclosure. The method for manufacturing the photoelectric conversion substrate provided in the present disclosure may include following steps 1 to 6.

Step 1: providing the base substrate 101.

The base substrate 101 may be made of glass, quartz, polyimide, polyethylene naphthalate (PEN), or polyethylene terephthalate (PET).

Figure 3:
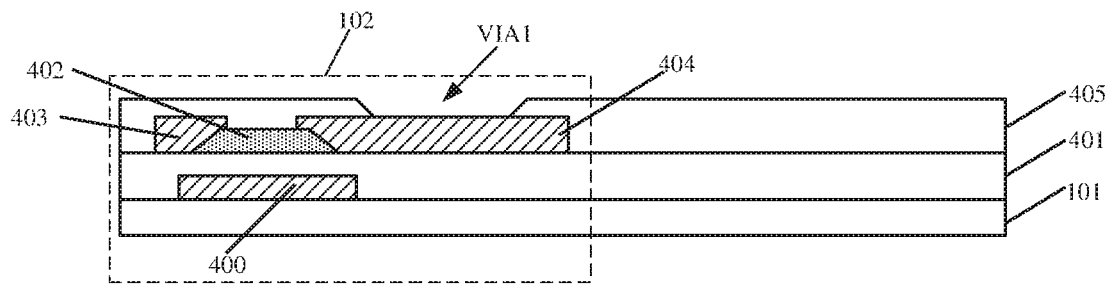
FIG. 3 is a structural schematic view of a base substrate after a TFT is formed on the base substrate using the method for manufacturing the photoelectric conversion substrate according to some embodiments of the present disclosure.

Step 2: forming the TFT 102 on the base substrate 101, as shown in FIG. 3.

During actual implementation, the step 2 may include following sub-steps 20-24.

Sub-step 20: depositing a gate metal layer onto the base substrate 101.

Specifically, the gate metal layer having a thickness of 500 Å to 4000 Å may be deposited onto the base substrate 101 through a sputtering process or a thermal evaporation process. The gate metal layer may be made of Cu, Al, Ag, Mo, Cr, Nd, Ni, Mn, Ti, Ta, W or an alloy thereof, and may be of a single-layer structure, or a multi-layer structure such as Cu/Mo, Ti/Cu/Ti, or Mo/Al/Mo.

Sub-step 21: applying a layer of photoresist onto the gate metal layer, and exposing the layer of photoresist by using a mask, so as to form a photoresist-reserved region and a photoresist-unreserved region, wherein the photoresist-reserved region corresponds to a region where a pattern of a gate electrode 400 is to be located, and the photoresist-unreserved region corresponds to a region other than the region where the pattern of the gate electrode 400 is to be located.

Sub-step 22: developing the base substrate 101 on which the layer of photoresist is applied.

In this sub-step, photoresist in the photoresist-unreserved region may be completely removed, and a thickness of photoresist in the photoresist-reserved region may remain unchanged. The gate metal layer corresponding to the photoresist-unreserved region may be etched off completely through an etching process, and remaining photoresist may be removed, so as to form the pattern of the gate electrode 400.

Sub-step 23: depositing a gate insulation layer 401 onto the base substrate 101 on which the pattern of the gate electrode 400 is formed.

Specifically, the gate insulation layer 401 having a thickness of 500 Å to 5000 Å may be deposited, through a plasma-enhanced chemical vapor deposition (PECVD) process, onto the base substrate 101 on which the gate electrode 400 is formed. The gate insulation layer 401 may be made of an oxide, a nitride or an oxynitride, and a reactive gas used correspondingly is $SiH_4$, $NH_3$, $N_2$, or $SiH_2Cl_2$, $NH_3$, $N_2$.

Sub-Step 24: depositing a semiconductor material layer onto the gate insulation layer 401, applying photoresist onto the semiconductor material layer, and exposing the photoresist by using a mask, so as to form a photoresist-reserved region and a photoresist-unreserved region.

The photoresist-reserved region corresponds to a region where a pattern of the active layer 402 is to be located, and the photoresist-unreserved region corresponds to a region other than the region where a pattern of the active layer 402 is to be located. Semiconductor material in the semiconductor material layer may be indium gallium zinc oxide (IGZO).

Sub-step 25: developing the photoresist, so as to completely remove the photoresist in the photoresist-unreserved region and keep a thickness of the photoresist in the photoresist-reserved region unchanged, and completely etching off the semiconductor material in the photoresist-unreserved region through an etching process, so as to form the pattern of the active layer 402.

Sub-step 26: forming a source/drain metal layer on the gate insulation layer 401. Specifically, the source/drain metal layer having a thickness of about 2000 Å to 4000 Å may be deposited onto the gate insulation layer 401 through a magnetron sputtering process, a thermal evaporation process or other film-forming process. The source/drain metal layer may be made of Cu, Al, Ag, Mo, Cr, Nd, Ni, Mn, Ti, Ta, W, or an alloy thereof, and may be a single-layer structure, or a multi-layer structure such as Cu/Mo, Ti/Cu/Ti, or Mo/Al/Mo.

Sub-step 27: applying a layer of photoresist onto the source/drain metal layer, and exposing the photoresist by using a mask, so as to form a photoresist-reserved region and a photoresist-unreserved region, wherein the photoresist-reserved region corresponds to regions where patterns of a source electrode 403 and a drain electrode 404 are to be located, and the photoresist-unreserved region corresponds to a region other than the regions where patterns of a source electrode 403 and a drain electrode 404 are to be located.

Sub-step 28: developing the photoresist, so as to completing remove the photoresist in the photoresist-unreserved region and keep a thickness of the photoresist in the photoresist-reserved region unchanged, and completely etching off the source/drain metal layer in the photoresist-unreserved region through an etching process, and removing remaining photoresist, so as to form the source electrode 403 and the drain electrode 404.

Sub-step 29: forming the interlayer insulation layer 405, and patterning the interlayer insulation layer 405 so as to form the first via-hole VIA1 through which the drain electrode 404 is exposed.

Specifically, the interlayer insulation layer 405 having a thickness of 500 Å to 5000 Å may be deposited, through the PECVD, onto the base substrate 101 on which the source electrode 403 and the drain electrode 404 are formed. The interlayer insulation layer 405 may be made of an oxide, a nitride or an oxynitride, and a reactive gas used correspondingly is $SiH_4$, $NH_3$, $N_2$, or $SiH_2Cl_2$, $NH_3$, $N_2$.

Figure 4:
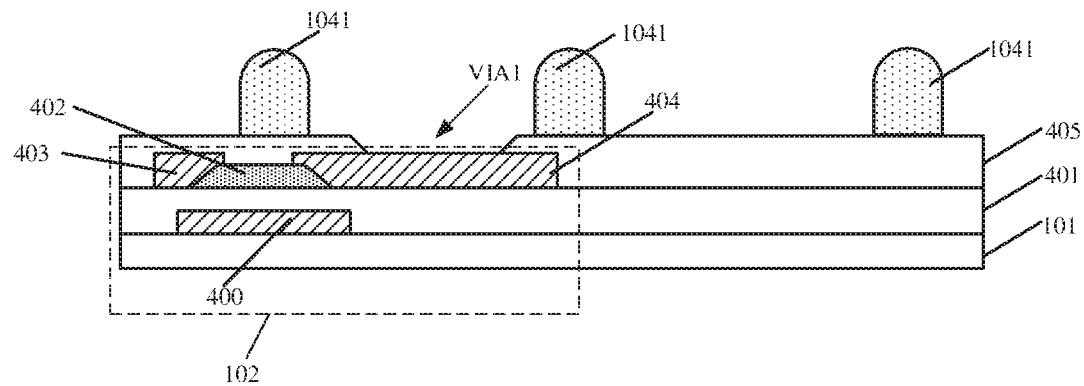
FIG. 4 is a structural schematic view of the base substrate after protrusive portions are formed on the base substrate using the method for manufacturing the photoelectric conversion substrate according to some embodiments of the present disclosure.

Step 3: forming the plurality of protrusive portions 1041 on the base substrate 101 manufactured after the step 2, as shown in FIG. 4.

Specifically, an organic resin layer having a thickness of 1 μm to 5 μm may be applied onto the base substrate 101 manufactured after the step 2, and then the organic resin layer may be patterned so as to form the plurality of protrusive portions 1041.

Figure 5:
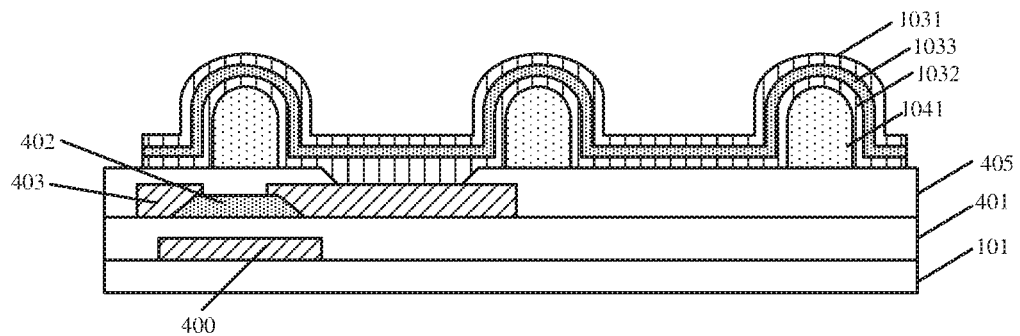
FIG. 5 is a structural schematic view of the base substrate after a photosensitive element is formed on the base substrate using the method for manufacturing the photoelectric conversion substrate according to some embodiments of the present disclosure.

Step 4: forming the photosensitive element 103 on the base substrate 101 manufactured after the step 3, as shown in FIG. 5.

Specifically, a conductive layer may be deposited, through a magnetron sputtering process, a thermal evaporation process or any other film-forming process, onto the base substrate 101 manufactured after the step 3, and then the conductive layer may be patterned so as to form the signal output electrode 1032. The signal output electrode 1032 may be made of organic materials or inorganic materials, the organic materials may include such as PEDOT: PSS, and the inorganic materials may include such as Cu, Al, Ag, Mo, Cr, Nd, Ni, Mn, Ti, Ta, W, or an alloy thereof.

Thereafter, a photosensitive material layer may be deposited onto the signal output electrode 1032, so as to form the photosensitive layer 1033. The photosensitive layer 1033 may be formed as a whole layer or a patterned layer. Next, a conductive layer may be deposited onto the photosensitive layer 1033 through a magnetron sputtering process, a thermal evaporation process or any other film-forming process, so as to form the light-transmissible electrode 1031. The light-transmissible electrode 1031 may be formed as a whole layer or a patterned layer. The light-transmissible electrode 1031 may be made of a transparent conductive material or a nontransparent conductive material. In a case that the light-transmissible electrode 1031 is made of the transparent conductive material, the visible light rays may be allowed to pass through the light-transmissible electrode 1031, and the photoelectric conversion substrate may detect the visible light rays. In a case that the light-transmissible electrode 1031 is made of the nontransparent conductive material, the infrared light rays rather than the visible light rays may be allowed to pass through the light-transmissible electrode 1031, and the photoelectric conversion substrate may detect the infrared light rays.

Figure 6:
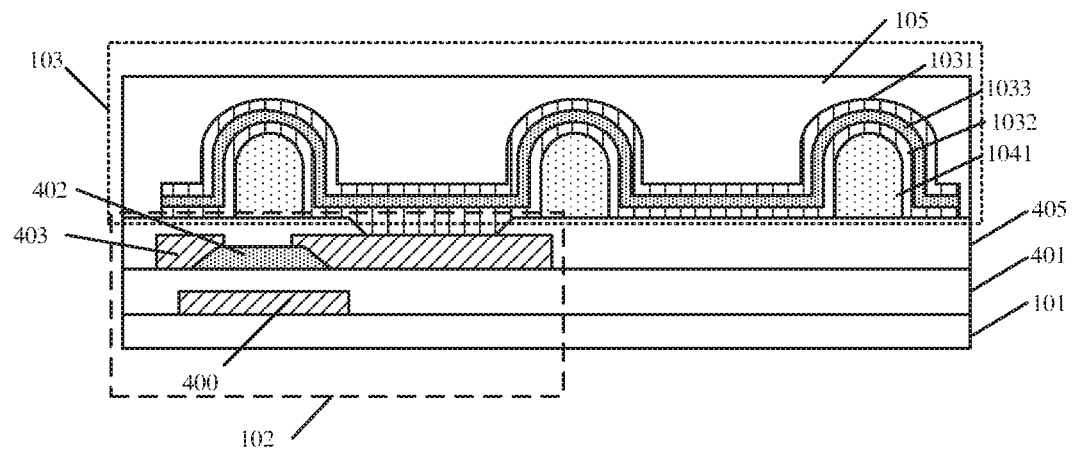
FIG. 6 is a structural schematic view of the base substrate after a planarization layer is formed on the base substrate using the method for manufacturing the photoelectric conversion substrate according to some embodiments of the present disclosure.
Figure 7:
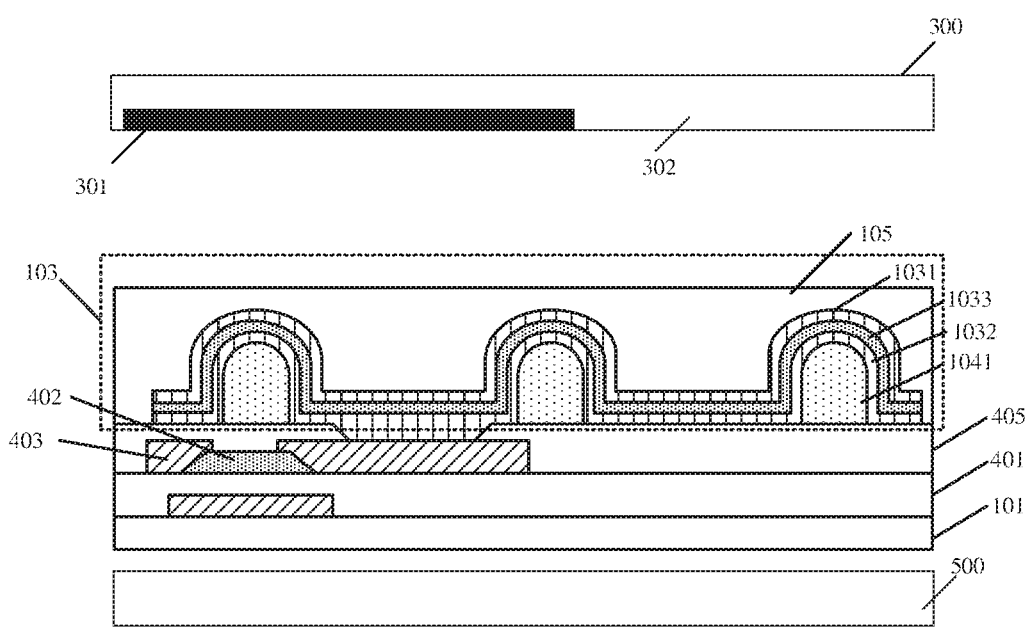
FIG. 7 is a structural schematic view of a display panel according to some embodiments of the present disclosure.

Step 5: forming the planarization layer 105 on the base substrate 101 manufactured after the step 4, as shown in FIG. 6.

Specifically, the planarization layer 105 having a thickness of 2000 Å to 10000 Å may be deposited, through a magnetron sputtering process, a thermal evaporation process, a PECVD process or any other film-forming process, onto the base substrate 101 manufactured after the step 4. The planarization layer 105 may be made of an oxide, a nitride or an oxynitride. Specifically, the planarization layer 105 may be made of SiNx, SiOx, Si(ON)x, or $Al_2O_3$, and may be of a single-layer structure, or a double-layer structure including a SiOx layer and a SiNx layer.

A photosensitive element manufactured according to the method in the present disclosure has a larger area, and thus the photosensitive area of the photosensitive element may be increased, the absorption efficiency of the photosensitive element to the light rays may be increased, thereby improving the photosensitivity of the photosensitive element as well as the detection accuracy of the photoelectric conversion substrate.

Some embodiments of the present disclosure further provides a display panel 1 including the above-mentioned photoelectric conversion substrate 100.

The display panel 1 further includes a color filter substrate 300 and a backlight source 500. The color filter substrate 300 is arranged opposite to the photoelectric conversion substrate 100 to form a cell. The backlight source 500 is arranged at a side of the photoelectric conversion substrate 100 away from the color filter substrate 300, and is configured to provide backlight for the photoelectric conversion substrate 100 and the color filter substrate 300. The backlight source 500 includes a predetermined light source configured to emit predetermined light rays. The color filter substrate 300 includes a black matrix 301 configured to shield a region where the TFT 102 is located. The black matrix 301 includes an aperture 302 corresponding to the photosensitive element 103.

When the display panel 1 is in operation, the predetermined light rays emitted from the predetermined light source may pass through the photoelectric conversion substrate 100 and the color filter substrate 300. When the display panel 1 is touched by a finger or any other object, the predetermined light rays emitted from the predetermined light source may be reflected by the finger or the other object. The predetermined light rays reflected by the finger or the other object may pass through aperture in the black matrix 301 and be incident onto the photosensitive element 103. The predetermined light rays may further pass through the light-transmissible electrode 1031 and be illuminated onto the photosensitive layer 1033. The photosensitive layer 1033 may generate an electric signal and thereby a touch detect may be performed. Since the photosensitive layer 1033 of the photosensitive element 103 is uneven, the area of the uneven photosensitive layer may be increased so that the photosensitive area of the photosensitive element is increased, and the absorption efficiency of the photosensitive element to the light rays is increased, and thereby the photosensitivity of the photosensitive element and a touch detection accuracy may be increased.

Some embodiments of the present disclosure further provide a display device including the above-mentioned display panel. The display device may be any product or any device having a display function, e.g., a television, a display, a digital photo frame, a mobile phone or a flat-panel computer. The display device may further include a flexible circuit board, a printed circuit board and a back plate.

Since the photosensitive layer of the photosensitive element in the photoelectric conversion substrate provided in some embodiments of the present disclosure is uneven, the area of the photosensitive layer may be increased due to a uneven characteristic of the photosensitive layer so that the photosensitive area of the photosensitive element is increased, and the absorption efficiency of the photosensitive element to the light rays is increased, and thereby the photosensitivity of the photosensitive element and the touch detection accuracy of the photoelectric conversion substrate may be increased.

Unless otherwise defined, any technical or scientific term used herein shall have a common meaning understood by a person of ordinary skills in the art. Such words as "first" and "second" used in the specification and claims are merely used to differentiate different components rather than to represent any order, number or importance. Similarly, appearances of such word as "including" or "include" mean only an element or an article preceding the word encompasses an element, an article, or equivalence behind the word, but does not exclude other element or articles. Such words as "connect/connected to" or "couple/coupled to" may include electrical connection, direct or indirect, rather than are limited to physical or mechanical connection. Such words as "on", "under", "left" and "right" are merely used to represent a relative position relationship, and when an absolute position of a described object is changed, the relative position relationship thereof is also changed.

It should be appreciated that, in a case that such an element as layer, film, region or substrate is arranged "on" or "under" another element, the element may be directly arranged "on" or "under" the other element, or an intermediate element may be arranged.

The above embodiments are for illustrative purposes only. It should be noted that a person of ordinary skills in the art may make further modifications and embellishments without departing from the spirit of the present disclosure, and these modifications and embellishments shall also fall within the scope of the present disclosure.

What is claimed is:

1. A photoelectric conversion substrate, comprising:
a thin film transistor (TFT), an insulation layer, and a photosensitive element on a base substrate, wherein the photosensitive element comprises a light-transmissible electrode, a signal output electrode, and a photosensitive layer between the light-transmissible electrode and the signal output electrode, a surface of the insulation layer is uneven, and the photosensitive element is on the insulation layer, the TFT is on the insulation layer, and a second electrode of the TFT is re-used as the signal output electrode;
a planarization layer covering the TFT and the photosensitive element;

a signal transmission line on the planarization layer; and
a gate insulation layer covering a gate electrode of the TFT and the insulation layer,
wherein the planarization layer comprises a via-hole through which a first electrode of the TFT is exposed, and the signal transmission line is connected to the first electrode through the via-hole,
wherein the light-transmissible electrode is configured to allow predetermined light rays to pass through the light-transmissible electrode and to be incident onto the photosensitive layer, and the signal output electrode is connected to the TFT, and the photosensitive layer is an uneven layer.

2. The photoelectric conversion substrate according to claim 1, wherein the insulation layer comprises a plurality of protrusive portions spaced apart from each other or a plurality of concave portions spaced apart from each other, and a portion or an entirety of the photosensitive element is on the plurality of protrusive portions spaced apart from each other or the plurality of concave portions spaced apart from each other.

3. The photoelectric conversion substrate according to claim 1, wherein the insulation layer is a whole-layer structure on the base substrate, and a gate electrode of the TFT is on the insulation layer and directly contacts the insulation layer.

4. The photoelectric conversion substrate according to claim 1, wherein the light-transmissible electrode is made of a transparent conductive material or a nontransparent conductive material, and the predetermined light rays comprise at least one of visible light rays and infrared light rays.

5. The photoelectric conversion substrate according to claim 2, wherein each of the plurality of protrusive portions is a column shape, a hemispherical shape or a step shape.

6. A display panel, comprising:
the photoelectric conversion substrate according to claim 1.

7. The display panel according to claim 6, further comprising:
a color filter substrate and a backlight source, wherein the color filter substrate is opposite to the photoelectric conversion substrate, and the backlight source is at a side of the photoelectric conversion substrate away from the color filter substrate and comprises a predetermined light source for emitting predetermined light rays,
wherein the color filter substrate comprises a black matrix configured to shield a region where the TFT is located, and the black matrix comprises an aperture corresponding to the photosensitive element.

8. A method for manufacturing a photoelectric conversion substrate, comprising:
forming an insulation material layer onto a base substrate, and patterning the insulation material layer so as to form an insulation layer, wherein a surface of the insulation layer is uneven; and
forming a Thin Film Transistor (TFT) and a photosensitive element on the insulation layer,
wherein the forming the photosensitive element comprises forming a signal output electrode, an uneven photosensitive layer and a light-transmissible electrode sequentially on the base substrate, the photosensitive layer is between the signal output electrode and the light-transmissible electrode, a second electrode of the TFT is re-used as the signal output electrode, and the signal output electrode is connected to the TFT, and the light-transmissible electrode is configured to allow predetermined light rays to pass through the light-transmissible electrode and to be incident onto the photosensitive layer; and
wherein the method further comprises:
forming a planarization layer covering the TFT and the photosensitive element, wherein the planarization layer comprises a via-hole through which a first electrode of the TFT is exposed;
forming a signal transmission line on the planarization layer, wherein the signal transmission line is connected to the first electrode through the via-hole.

9. The method according to claim 8, wherein the insulation layer comprises a first portion having an even surface and a second portion having an uneven surface, and forming the TFT and the photosensitive element on the insulation layer comprises:
forming the TFT on the first portion of the insulation layer; and
forming the photosensitive element on the second portion of the insulation layer.

* * * * *